(12) United States Patent
Ishikawa

(10) Patent No.: US 7,709,947 B2
(45) Date of Patent: May 4, 2010

(54) SEMICONDUCTOR DEVICE HAVING SEMICONDUCTOR ELEMENT WITH BACK ELECTRODE ON INSULATING SUBSTRATE

(75) Inventor: Jun Ishikawa, Kariya (JP)

(73) Assignee: Kabushiki Kaisha Toyota Jidoshokki (JP)

( * ) Notice: Subject to any disclaimer, the term of this patent is extended or adjusted under 35 U.S.C. 154(b) by 57 days.

(21) Appl. No.: 11/763,150

(22) Filed: Jun. 14, 2007

(65) Prior Publication Data

US 2007/0290342 A1 Dec. 20, 2007

(30) Foreign Application Priority Data

Jun. 15, 2006 (JP) ............... 2006-165781

(51) Int. Cl.
*H01L 23/48* (2006.01)

(52) U.S. Cl. .............................. 257/692; 257/E23.011; 257/E23.012; 257/E23.031; 257/E23.034; 257/E23.043; 257/E33.066; 257/678; 257/666; 257/691; 257/698; 257/734

(58) Field of Classification Search ................. 257/668, 257/670, 673, 711, E23.01, E23.039, E23.043, 257/689, 692, 693, 696, 697, 707, 666, 671, 257/678, 690, 691, 694, 695, 698, 700, 701, 257/702, 703, 723, 724, 734, 735, 737, 773, 257/E23.011, E23.012, E23.031, E23.034, 257/E33.066

See application file for complete search history.

(56) References Cited

U.S. PATENT DOCUMENTS

| 6,404,065 | B1* | 6/2002 | Choi .......................... 257/782 |
| 6,914,321 | B2* | 7/2005 | Shinohara ................... 257/678 |
| 2002/0140078 | A1 | 10/2002 | Yamada ...................... 257/690 |
| 2004/0089928 | A1* | 5/2004 | Nakajima et al. ........... 257/678 |
| 2005/0093137 | A1* | 5/2005 | Ishikawa et al. ............ 257/712 |

FOREIGN PATENT DOCUMENTS

| DE | 101 57 362 A1 | 6/2003 |
| JP | 55-103734 | 8/1980 |
| JP | 55-121660 | 9/1980 |
| JP | 63-84127 | 4/1988 |

(Continued)

OTHER PUBLICATIONS

Machine Translation of JP 2002-009190.*

(Continued)

*Primary Examiner*—David Vu
*Assistant Examiner*—Suberr Chi
(74) *Attorney, Agent, or Firm*—Woodcock Washburn LLP

(57) ABSTRACT

The first external electrode has a main body portion a part of which is buried in a side wall of a case and joining portions protruding from an end of the main body portion toward the inside of the case. Each joining portion of the first external electrode is formed to have a thickness smaller than that of the main body portion, and an end portion of each joining portion is directly joined onto a wiring pattern of the insulating substrate through ultrasonic joining. Therefore, a load and ultrasonic vibration necessary for joining the joining portion onto the wiring pattern can be suppressed, which makes it possible to directly join the first external electrode onto the wiring pattern of the insulating substrate without damaging an insulating member of the insulating substrate.

4 Claims, 2 Drawing Sheets

FOREIGN PATENT DOCUMENTS

| | | |
|---|---|---|
| JP | 3-123042 | 5/1991 |
| JP | 11-145188 | 5/1999 |
| JP | 2002-009190 | 11/2002 |
| WO | WO 2005/048347 A2 | 5/2005 |
| WO | WO 2005/075302 A1 | 8/2005 |

OTHER PUBLICATIONS

Machine Translation of JP 1999-145188.*

Anonymous, "Lead Modification for Solderless Attachment of Flatpack Components", Research Disclosure, Sep. 1990, 317(112), 1 page, XP 007115600.

* cited by examiner

SEMICONDUCTOR DEVICE HAVING SEMICONDUCTOR ELEMENT WITH BACK ELECTRODE ON INSULATING SUBSTRATE

BACKGROUND OF THE INVENTION

1. Field of the Invention

The present invention relates to a semiconductor device in which a semiconductor element is disposed on an insulating substrate.

2. Description of the Related Art

Conventionally, a semiconductor device is known in which a semiconductor element is disposed on an insulating substrate. The insulating substrate has a planar insulating member made of ceramics or the like and a wiring pattern formed on an upper surface of the insulating member and made of copper or the like. A back electrode of the semiconductor element is joined onto the wiring pattern by soldering.

For example, by connecting an external electrode disposed independently of the insulating substrate with the wiring pattern of the insulating substrate through wire bonding in such a semiconductor device, the back electrode of the semiconductor element can be taken out to the outside of the device through the external electrode.

However, when the wiring pattern of the insulating substrate and the external electrode are connected through wire bonding as described above, in order to prevent a bonding tool from interfering with parts inside the semiconductor device, it is necessary to provide a clearance in the vicinity of bonding portions, which makes the semiconductor device larger.

Further, because wire used for the wire bonding has a small cross-sectional area through which current passes, the electrical resistance is large. And, the inductance of the wire is also large. Thus, there is a problem that the electrical energy loss is large.

Herein, it can be considered that, by directly joining the external electrode onto the wiring pattern of the insulating substrate through ultrasonic joining, the back electrode of the semiconductor element is taken out to the outside of the device through the external electrode.

However, because an insulating member located under the wiring pattern in the insulating substrate is made of ceramics or the like and is brittle compared with copper or the like forming the wiring pattern, when the external electrode is ultrasonically joined onto the wiring pattern of the insulating substrate, there is a fear that the insulating member of the insulating substrate is damaged such as being cracked or broken due to stress of ultrasonic vibration or due to a load during the joining.

For example, in a semiconductor device disclosed in JP 11-145188 A, a metal bump for absorbing the load during the joining and the ultrasonic vibration is formed on an electrode pad provided on an upper surface of a semiconductor chip. By joining a lead frame onto the metal bump, ultrasonic joining can be performed while the semiconductor chip is prevented from being damaged.

However, when the joining method disclosed in JP 11-145188 A is applied to joining of an external electrode onto a wiring pattern of an insulating substrate, it is necessary to provide a metal bump on the wiring pattern of the insulating substrate, which makes the structure complicated. Further, because the number of process steps as a whole is increased in order to form the metal bump, additional effort has to be taken in the manufacture. Those situations are problematic.

SUMMARY OF THE INVENTION

The present invention has been made to solve such problems, and an object of the present invention is to provide a semiconductor device which has a simple structure and can be manufactured with ease.

According to the present invention, there is provided a semiconductor device including: an insulating substrate having a planar insulating member and a conductive wiring pattern formed on an upper surface of the insulating member; a semiconductor element having a back electrode which is joined onto the wiring pattern of the insulating substrate; and an external electrode having a main body portion and at least one joining portion protruding from one end of the main body portion, the other end of the main body portion being used as an external terminal, the joining portion being formed thinner than the main body portion. In the semiconductor device, the joining portion of the external electrode is directly joined onto the wiring pattern of the insulating substrate through ultrasonic joining so that the external electrode is electrically connected to the back electrode of the semiconductor element through the wiring pattern of the insulating substrate.

DETAILED DESCRIPTION OF THE PREFERRED EMBODIMENTS

Now, embodiments of the present invention will be described with reference to the accompanying drawings.

Figure 1:
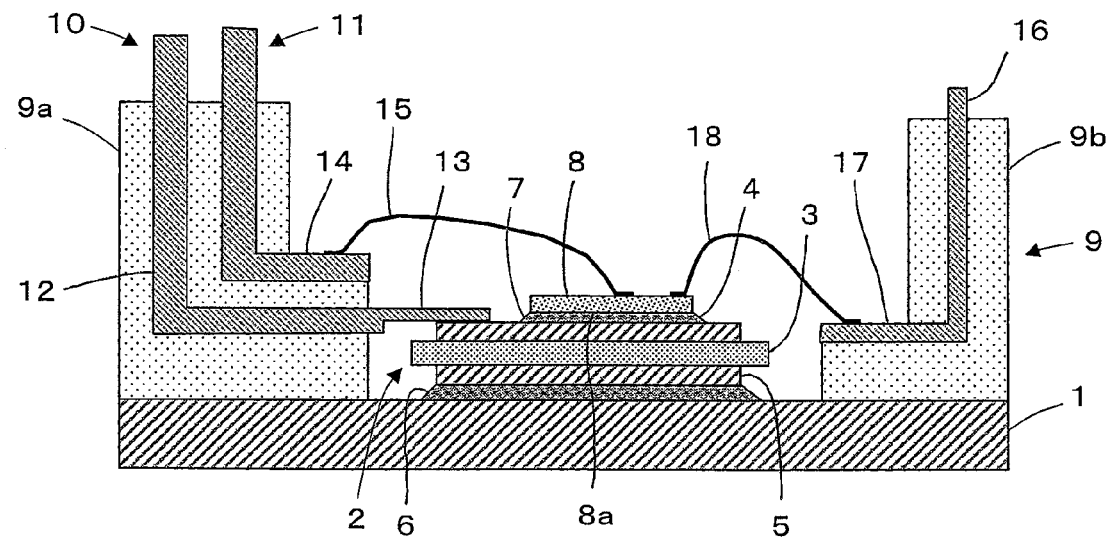
FIG. 1 is a side view illustrating a semiconductor device according to Embodiment 1 of the present invention.

Embodiment 1:

FIG. 1 illustrates a semiconductor device according to Embodiment 1 of the present invention. The semiconductor device is used as a power module or the like. The device has a base plate 1 made of copper which dissipates heat. An insulating substrate 2 is disposed on the base plate 1. The insulating substrate 2 has a flat-shaped insulating member 3 made of ceramics. A wiring pattern 4 made of copper is formed on an upper surface of the insulating member 3 while a joining pattern 5 made of copper is formed on a lower surface of the insulating member 3. The joining pattern 5 of the insulating substrate 2 is joined to an upper surface of the base plate 1 through solder 6 while a back electrode 8a of a semiconductor element 8 such as a power chip is joined to an upper surface of the wiring pattern 4 of the insulating substrate 2 through solder 7, thereby mounting the semiconductor element 8 on the base plate 1 through the insulating substrate 2.

A case 9 is fixed to a periphery of the base plate 1 so as to stand on the base plate 1. The semiconductor element 8 and the like disposed on the base plate 1 are housed in the case 9. A first external electrode 10 and a second external electrode 11 each of which is L-shaped in section are implanted in a side wall 9a of the case 9 by insert molding. Both ends of the first external electrode 10 and the second external electrode 11 are extended from the inside to the outside of the case 9. The second external electrode 11 is positioned above the first external electrode 10 so as to be opposed to the first external electrode 10.

The first external electrode 10 is made of copper, and has a main body portion 12 a part of which is buried in the side wall 9a of the case 9 and two joining portions 13 each of which is formed so as to protrude from one end of the main body portion 12 toward the inside of the case 9. The other end of the main body portion 12 is extended from an upper end portion of the side wall 9a to the outside of the case 9 to set up a main circuit terminal of the semiconductor element 8. Each joining portion 13 of the first external electrode 10 is formed to have a thickness smaller than that of the main body portion 12, and an end portion of each joining portion 13 is directly joined onto the wiring pattern 4 of the insulating substrate 2 through ultrasonic joining. In this way, the first external electrode 10 is electrically connected to the back electrode 8a of the semiconductor element 8 through the wiring pattern 4.

It should be noted that, for example, the first external electrode 10 is preferably formed such that the main body portion 12 has a thickness of about 1 mm and each of the joining portions 13 has a thickness of 0.5 mm or less.

An end portion of the second external electrode 11 is exposed inside the case 9. This exposed portion 14 of the second external electrode 11 and a corresponding electrode portion on an upper surface of the semiconductor element 8 are connected through bonding wires 15. Similarly to the case of the first external electrode 10, the other end of the second external electrode 11 is also extended from the upper end portion of the side wall 9a to the outside of the case 9 to set up a main circuit terminal of the semiconductor element 8.

Further, third external electrodes 16 each of which is L-shaped in section are implanted in another side wall 9b of the case 9 by insert molding and are extended from the inside to the outside of the case 9. An end portion of each third external electrode 16 is exposed inside the case 9. These exposed portions 17 of the third external electrodes 16 and corresponding electrode portions on the upper surface of the semiconductor element 8 are connected each other through bonding wires 18. The other end of each third external electrode 16 is extended from an upper end portion of the side wall 9b to the outside of the case 9 to set up control terminal for supplying a control signal to the semiconductor element 8.

Figure 2:
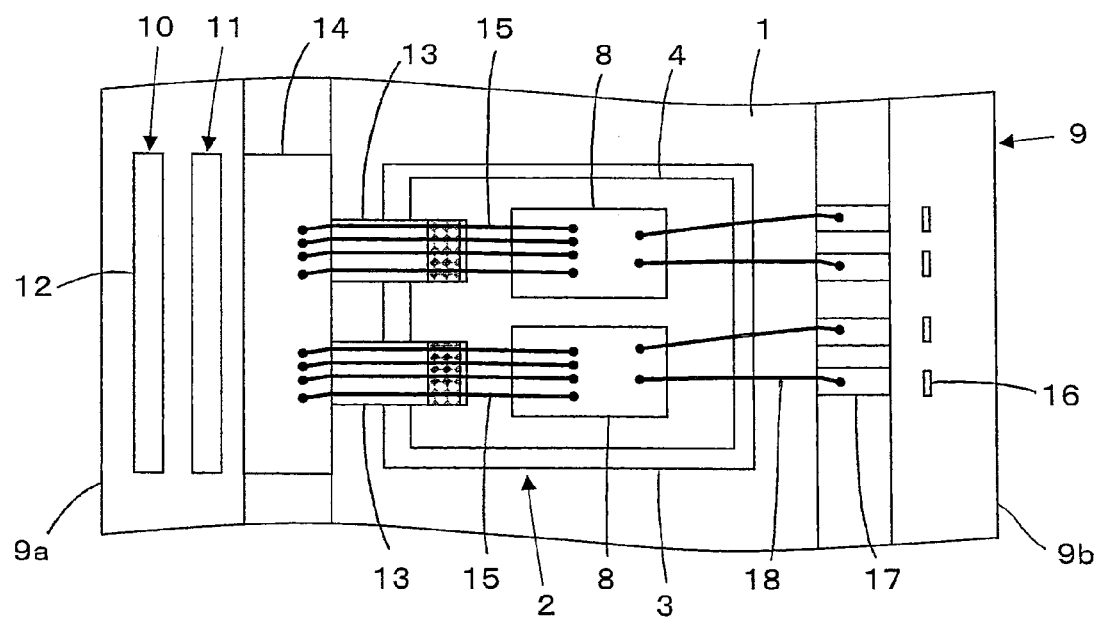
FIG. 2 is a plan view illustrating the semiconductor device according to Embodiment 1 of the present invention.

As illustrated in FIG. 2, the main body portion 12 of the first external electrode 10 a part of which is buried in the side wall 9a of the case 9 has a plate shape extending in a width direction of the side wall 9a. The first external electrode 10 protrudes from the side wall 9a of the case 9 toward the inside of the case 9 to branch into two joining portions 13 which are spaced apart from each other. The end portion of each joining portion 13 is joined onto the wiring pattern 4 of the insulating substrate 2. Each of the joining portions 13 of the first external electrode 10 may be formed so as to have approximately 2 mm in width, for example.

Two semiconductor elements 8 are arranged on the upper surface of the wiring pattern 4 of the insulating substrate 2. Further, similarly to the main body portion 12 of the first external electrode 10, the second external electrode 11 has a plate shape extending in the width direction of the side wall 9a of the case 9. Four strip-like third external electrodes 16 are disposed so as to be spaced apart one another in a width direction of the side wall 9b of the case 9.

For example, by providing a source (or an emitter) electrode and a gate electrode on the upper surface of the semiconductor element 8, providing a drain (or collector) electrode as the back electrode 8a of the semiconductor element 8, connecting the second external electrode 11 to the source (or emitter) electrode through the bonding wire 15, and connecting the third external electrodes 16 to the gate electrode through the bonding wire 18, the second external electrode 11, the third external electrodes 16, and the first external electrode 10 can be used as the source (or emitter) electrode, the gate electrode, and the drain (or collector) electrode, respectively, of the semiconductor device.

As described above, the first external electrode 10 has the joining portions 13 each of which is formed thinner than the main body portion 12 and is ultrasonically joined 13 onto the wiring pattern 4 of the insulating substrate 2. Therefore, ultrasonic vibration and a load necessary for joining the joining portions 13 onto the wiring pattern 4 can be suppressed. This makes it possible to directly join the first external electrode 10 onto the wiring pattern 4 of the insulating substrate 2 through ultrasonic joining without damaging such as cracking or breaking the insulating member 3 positioned under the wiring pattern 4 in the insulating substrate 2.

Therefore, it is not necessary to provide a metal bump on the wiring pattern 4 of the insulating substrate 2 for absorbing a load during the joining and stress due to ultrasonic vibration, and thus, a semiconductor device which has a simple structure and can be manufactured with ease can be materialized.

Further, because the first external electrode 10 protrudes from the side wall 9a of the case 9 toward the inside of the case 9 to branch into the two joining portions 13, the two joining portions 13 can be separately joined onto the wiring pattern 4 of the insulating substrate 2 through ultrasonic joining, which makes it possible to further suppress the load and ultrasonic vibration necessary when each joining portion 13 is joined onto the wiring pattern 4. Therefore, the first external electrode 10 is joined onto the wiring pattern 4 of the insulating substrate 2 while the effect on the insulating member 3 during the ultrasonic joining can be further decreased.

Further, because it is not necessary to connect through wire bonding the first external electrode 10 and the wiring pattern 4 of the insulating substrate 2, it is not required to secure a clearance for preventing interference of a bonding tool, and a small-sized semiconductor device can be materialized. Further, because the first external electrode 10 and the wiring pattern 4 are directly connected without bonding wire, the electrical energy loss can be made smaller.

Still further, because only the joining portions 13 of the first external electrode 10 are formed thin and the main body portion 12 of the first external electrode 10 is formed thick, the cross-sectional area through which current passes is secured, and the electrical energy loss can be made further smaller.

Further, because the semiconductor element 8 is disposed on the base plate 1 made of copper through the insulating substrate 2, heat generated in the semiconductor element 8 passes through the wiring pattern 4, the insulating member 3, and the joining pattern 5 of the insulating substrate 2 to dissipate from the base plate 1 to the outside efficiently.

Three first external electrodes 10 of the same size and shape were formed by using copper having Vickers hardnesses of 115 Hv, 90 Hv, and 53 Hv, respectively, and the joining portions 13 of each first external electrode 10 were joined onto the wiring pattern 4 of the insulating substrate 2 through ultrasonic joining. Here, whether the joining could be carried out or not and damage to the ceramics are described in the following. The joining was carried out with regard to all of those three first external electrodes 10 by use of ultrasonic joining equipment under the same conditions, that is, a load of 300 N, a frequency of 30 kHz, an amplitude of 60 μm, and power of 1000 W. The main body portion 12 of each first external electrode 10 was formed into about 1 mm in thickness while each joining portion 13 was formed into about 0.5 mm in thickness.

After the ultrasonic joining, the tensile test was carried out to determine whether the joining portions 13 of each first external electrode 10 were joined onto the wiring pattern 4 of the insulating substrate 2 with sufficient joining force or not and whether the ceramics forming the insulating member 3 was damaged or not by measuring withstand voltage of the ceramics.

As a result, with regard to all of the three first external electrodes 10 made of copper having Vickers hardnesses of 115 Hv, 90 Hv, and 53 Hv, respectively, it was found that the joining portions 13 of each first external electrode 10 were satisfactorily joined onto the wiring pattern 4 of the insulating substrate 2 and the ceramics forming the insulating member 3 was not damaged.

In particular, even when the first external electrode 10 was made of copper having a Vickers hardness of 115 Hv or 90 Hv, the joining was satisfactorily performed and the ceramics was not damaged. Therefore, even when the first external electrode 10 is made of hard copper having a Vickers hardness of 80 Hv or more (so-called H material), the joining portions 13 of the first external electrode 10 can be directly joined onto the wiring pattern 4 of the insulating substrate 2 through ultrasonic joining without damaging the insulating member 3.

It should be noted that, instead of copper, the first external electrode 10 may be made of aluminum or the like.

Further, the first external electrode 10 has the two branched joining portions 13. Alternatively, the first external electrode 10 including three or more joining portions which are branched mutually may be formed. In this case also, by forming each joining portion thinner than the main body portion 12 and joining the first external electrode 10 onto the wiring pattern 4 of the insulating substrate 2 at each joining portion through ultrasonic joining, the joining portions of the first external electrode 10 can be directly joined onto the wiring pattern 4 of the insulating substrate 2 without damaging the insulating member 3.

Embodiment 2

Figure 3:
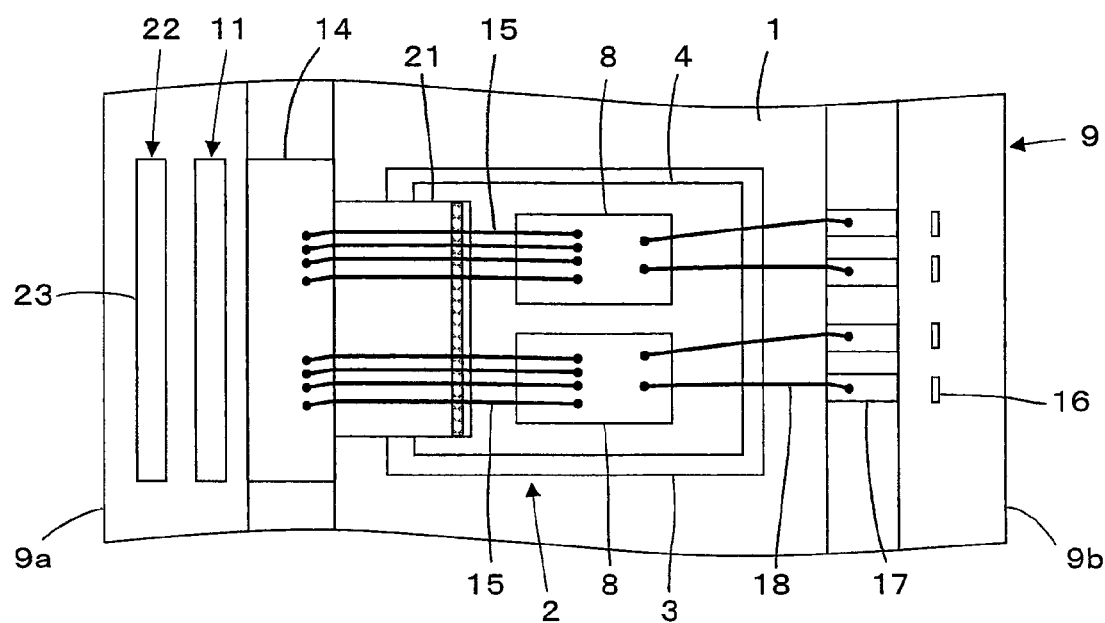
FIG. 3 is a plan view illustrating a semiconductor device according to Embodiment 2 of the present invention.

Next, with reference to FIG. 3, a semiconductor device according to Embodiment 2 of the present invention is described. In Embodiment 2, instead of the first external electrode 10 having the two branched joining portions 13 in the semiconductor device in Embodiment 1, a first external electrode 22 having one wide joining portion 21 is used. Similarly to the case of the first external electrode 10 in Embodiment 1, the joining portion 21 of the first external electrode 22 is formed so as to be thinner than a main body portion 23. The first external electrode 22 is made of aluminum or the like and an end portion of the joining portion 21 is directly joined onto the wiring pattern 4 of the insulating substrate 2 through ultrasonic seam welding or the like. Ultrasonic seam welding is a method of continuously joining the joining portion 21 onto the wiring pattern 4 in a width direction of the joining portion 21 by use of a disk-shaped tool, and is known as one of ultrasonic joining methods.

It should be noted that, for example, the first external electrode 22 is preferably formed such that the main body portion 23 has a thickness of about 1 mm and the joining portion 21 has a thickness of about 0.2 to 0.4 mm.

The joining portion 21 of the first external electrode 22 may have, for example, about 10 mm in width.

It is preferable that the first external electrode 22 be made of soft pure aluminum or the like having a particularly small Vickers hardness among various kinds of aluminum.

In this structure also, because the first external electrode 22 has the joining portion 21 which is formed thinner than the main body portion 23 and the first external electrode 22 is ultrasonically joined onto the wiring pattern 4 of the insulating substrate 2 at the joining portion 21, a load and ultrasonic vibration necessary for the joining can be suppressed. This makes it possible to directly join the first external electrode 22 onto the wiring pattern 4 of the insulating substrate 2 without damaging the insulating member 3. Therefore, it is not necessary to provide a metal bump for absorbing a load during the joining and stress due to ultrasonic vibration on the wiring pattern 4 of the insulating substrate 2, and a semiconductor device which has a simple structure and can be manufactured with ease can be materialized.

In addition, in Embodiment 2, because the first external electrode 22 has the one wide joining portion 21, the joining portion 21 can be joined onto the wiring pattern 4 of the insulating substrate 2 in one joining step, and thus, the device can be manufactured more easily.

Further, because the wide joining portion 21 is used, the inductance can be further decreased, and thus, the electrical energy loss can be made further smaller.

It should be noted that, in Embodiments 1 and 2 described above, both the wiring pattern 4 and the joining pattern 5 of the insulating substrate 2 are made of copper. Alternatively, both the wiring pattern 4 and the joining pattern 5 may be made of aluminum. Further, one of the wiring pattern 4 and the joining pattern 5 may be made of copper and the other one may be made of aluminum.

Aluminum nitride, alumina, silicon nitride, or the like can be used as the ceramics forming the insulating member 3 of the insulating substrate 2.

Further, in Embodiments 1 and 2 described above, the joining portions 13 and 21 of the first external electrodes 10 and 22 serving as the main circuit terminal of the semiconductor element 8 are formed thin. However, the present invention is not limited thereto. The present invention may be applied to an external electrode one end of which is extended to the outside of the device to be used as an external terminal such as a main circuit terminal or a control terminal and the other end of which is ultrasonically joined onto the wiring pattern 4 of the insulating substrate 2. More specifically, by forming a joining portion thinner than a main body portion of the external electrode and ultrasonically joining the external electrode onto the wiring pattern 4 of the insulating substrate 2 at the joining portion, the external electrode can be directly joined onto the wiring pattern 4 without damaging the insulating member 3 of the insulating substrate 2.

Still further, in Embodiments 1 and 2 described above, there is used the insulating substrate 2 which has the insulating member 3 and has the wiring pattern 4 and the joining pattern 5 formed on the upper surface and the lower surface of the insulating member 3, respectively. Alternatively, an insulating substrate having a metal substrate made of aluminum, copper, or the like, an insulating resin layer serving as an insulating member, and a wiring pattern made of aluminum, copper, or the like laminated in this order may be used.

What is claimed is:

1. A semiconductor device, comprising:
   an insulating substrate having a planar insulating member and a conductive wiring pattern formed on an upper surface of the insulating member;

a semiconductor element having a back electrode which is joined onto the wiring pattern of the insulating substrate, the semiconductor element having at least one electrode on an upper surface of the semiconductor element, the semiconductor element further having an electrode on a bottom surface of the semiconductor element as the back electrode; and an external electrode,
the external electrode being implanted to a case and having a main body portion, the main body portion being buried in the case,
the external electrode further having at least one joining portion protruding toward the semiconductor element from an inner side of a side wall of the case,
the external electrode further having an external terminal, the external terminal being extended from an upper end portion of the case to the outside of the case,
the main body portion, the joining portion and the external terminal are formed integrally within one member, the joining portion of the external electrode being directly and ultrasonically joined onto the wiring pattern of the insulating substrate so that the external electrode is electrically connected to the back electrode of the semiconductor element through the wiring pattern of the insulating substrate, the joining portion being formed thinner than the main body portion so that ultrasonic vibration and a load necessary for joining the joining portion onto the wiring pattern can be suppressed, wherein the external electrode has a plurality of branched joining portions and the plurality of joining portions are directly joined onto the wiring pattern of the insulating substrate through ultrasonic joining, respectively.

2. A semiconductor device according to claim 1, wherein the main body portion of the external electrode has a thickness of about 1 mm and each of the joining portions has a thickness of 0.5 mm or less.

3. A semiconductor device according to claim 1, wherein the external electrode is made of copper having a Vickers hardness of 80 Hv or more.

4. A semiconductor device according to claim 1, wherein the insulating member of the insulating substrate is made of ceramics.

* * * * *